United States Patent
Martines et al.

(10) Patent No.: US 6,560,145 B2
(45) Date of Patent: May 6, 2003

(54) CHARGE PUMP FOR A NONVOLATILE MEMORY WITH READ VOLTAGE REGULATION IN THE PRESENCE OF ADDRESS SKEW, AND NONVOLATILE MEMORY COMPRISING SUCH A CHARGE PUMP

(76) Inventors: Ignazio Martines, Via Antonello da Messina, 43, Acicastelllo (IT), I-95021; Luigi Buono, Via Mandra, 33, Catania (IT), I-95021

( * ) Notice: Subject to any disclaimer, the term of this patent is extended or adjusted under 35 U.S.C. 154(b) by 0 days.

(21) Appl. No.: 10/068,560

(22) Filed: Feb. 5, 2002

(65) Prior Publication Data

US 2002/0131303 A1 Sep. 19, 2002

(30) Foreign Application Priority Data

Feb. 6, 2001 (EP) .............................................. 01830070

(51) Int. Cl.[7] .............................................. G11C 16/00
(52) U.S. Cl. .............................. 365/185.18; 365/185.23; 365/226; 327/536
(58) Field of Search ....................... 365/185.18, 185.23, 365/226, 233.5, 189.11; 327/536; 331/175, 177 R

(56) References Cited

U.S. PATENT DOCUMENTS

| | | | |
|---|---|---|---|
| 5,389,898 A | 2/1995 | Taketoshi et al. | 331/2 |
| 5,633,825 A | 5/1997 | Sakuta et al. | 365/189.09 |
| 5,761,108 A | 6/1998 | Martin | 365/49 |
| 6,320,797 B1 * | 11/2001 | Liu | 365/226 |
| 6,424,570 B1 * | 7/2002 | Lê et al. | 365/185.18 |
| 6,476,665 B2 * | 11/2002 | Buchschacher | 327/536 |

* cited by examiner

Primary Examiner—Tan T. Nguyen

(57) ABSTRACT

A charge pump for a nonvolatile memory, having a clock generator circuit supplying an output clock signal; a phase generator circuit receiving the output clock signal, and supplying phase signals; and a voltage booster circuit receiving a supply voltage supplied from outside to the nonvolatile memory and the aforesaid phase signals, and supplying a read voltage higher than the supply voltage. The clock generator circuit includes a comparator receiving the read voltage and a reference voltage, and supplying a selection signal indicating the outcome of the comparison between the read and reference voltages; and a multiplexer receiving a first input clock signal having a pre-set frequency, a second input clock signal having a frequency correlated to the transition frequency of the addresses supplied to the nonvolatile memory, and the selection signal, and supplying the aforesaid output clock signal.

19 Claims, 5 Drawing Sheets

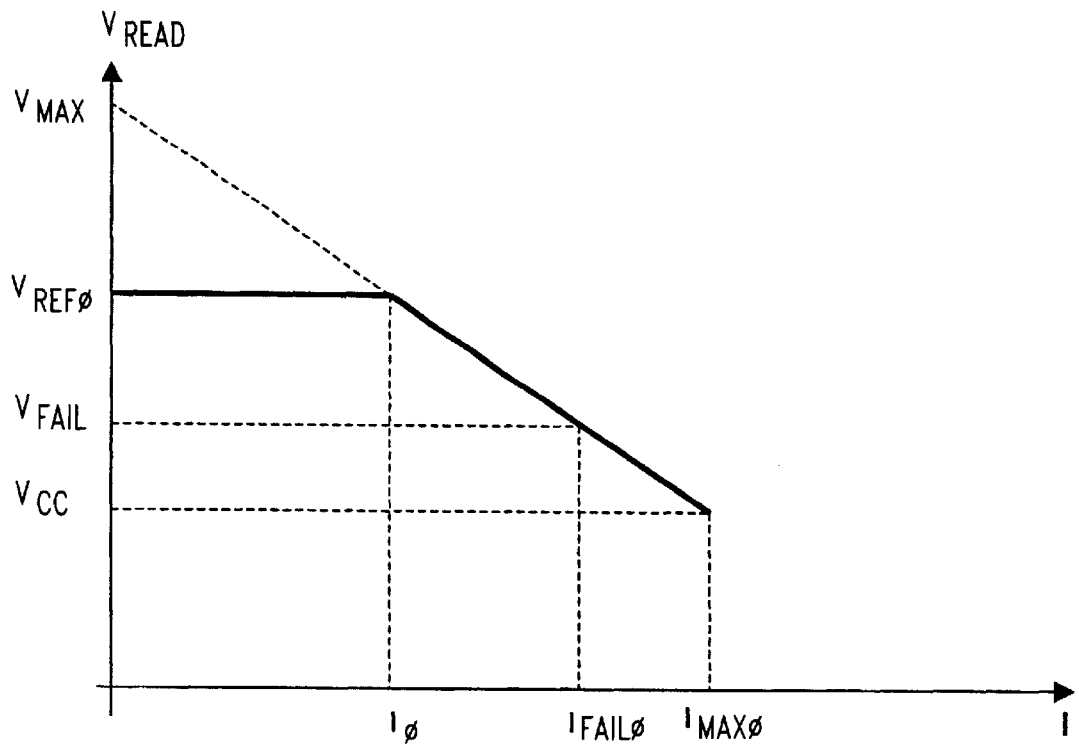
Fig. 2
*(Prior Art)*
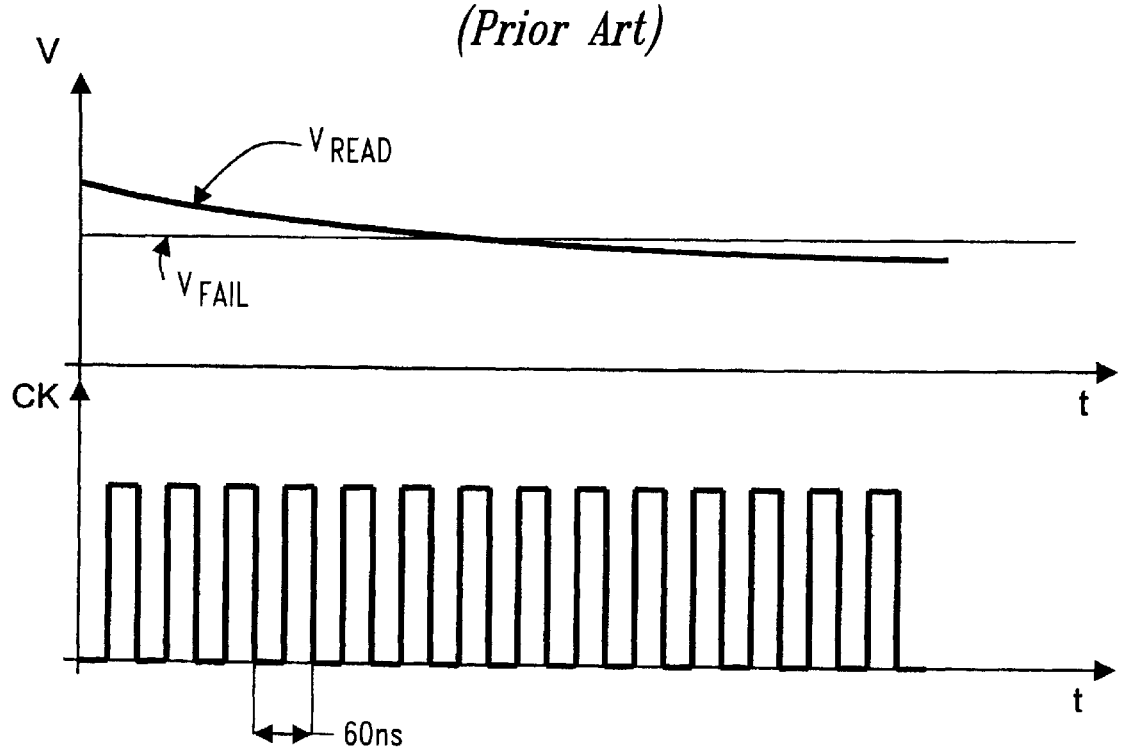
Fig. 3 *(Prior Art)*

CHARGE PUMP FOR A NONVOLATILE MEMORY WITH READ VOLTAGE REGULATION IN THE PRESENCE OF ADDRESS SKEW, AND NONVOLATILE MEMORY COMPRISING SUCH A CHARGE PUMP

BACKGROUND OF THE INVENTION

1. Field of the Invention

The present invention relates to a charge pump for a memory device, and more particularly relates to a charge pump for a nonvolatile memory with read voltage regulation in the presence of address skew and to a memory device comprising such a charge pump.

2. Description of the Related Art

As is known, the most recent research in nonvolatile memories, in particular EPROM and FLASH memories, is aimed, on the one hand, at achieving increasingly higher data-storage capacities, and, on the other, at producing memories that are able to operate at low supply voltages to meet the ever-increasing demand for lower consumption typical of portable devices, such as cellphones, digital photocameras, MP3 readers, smart cards, etc., or of consumer electronics.

It is therefore necessary to supply, to the gate terminals of the memory cells, read voltages that are typically higher than the single supply voltage supplied from outside to the memory in order to guarantee a correct reading of the memory cells in any situation.

The read voltages are currently obtained by means of charge pumps having the purpose of boosting the single supply voltage supplied from outside to the memory by an amount such as to reach the read voltage necessary for supplying a sufficient read current to the memory cells.

BRIEF SUMMARY OF THE INVENTION

By way of example, FIG. 1 shows the circuit diagram of a nonvolatile memory using a charge pump according to the prior art. In particular, in FIG. 1 only the parts of the nonvolatile memory that are useful for understanding the present invention are shown.

As illustrated in FIG. 1, the nonvolatile memory, designated as a whole by 1, comprises a row predecoder stage 2 receiving, via an input buffer 4, the addresses ADD supplied to the memory 1, and a row decoder stage 6 cascade-connected to the row predecoder stage 2 and having a plurality of outputs connected to respective word lines 8 of a memory array 10, and on which respective biasing voltages for the word lines 8 are supplied.

The nonvolatile memory 1 further comprises a charge pump 12 having a supply input connected to a supply line 14 set at a supply voltage $V_{CC}$ (typically 2.7–3.8 V) supplied from outside to the memory 1, and an output supplying a read voltage $V_{READ}$ higher than the supply voltage $V_{CC}$, which is then supplied to an input of the row decoder stage 6, which uses it for biasing the word lines 8 during the step of reading of the data stored in the memory array 10.

The charge pump 12 comprises a voltage boosting circuit 16 receiving on an input the supply voltage $V_{CC}$ and supplying on an output the read voltage $V_{READ}$, and is formed by a plurality of booster stages 18 cascaded together between the input and the output of the charge pump 12.

In particular, the booster stages 18 are of the so-called Dickson type, and are implemented by means of a MOS transistor-boosting capacitor pair and a MOS transistor-pumping capacitor pair appropriately connected together.

Charge transfer from one boosting stage 18 to the next towards the output is via commands from mutually complementary logic-type phase signals, in the example illustrated in FIG. 1 four phase signals designated by A, B, C, D, which are supplied to inputs of the booster stages 18 and are generated by a phase generating circuit 20, which is a logic circuit of a generally known type, and comprises a clock generator stage 22 basically formed by an oscillator supplying on an output a clock signal CK having a pre-set frequency, and a non-overlapping signal generator stage 24 receiving on an input the clock signal CK supplied by the clock generator stage 22, and supplying on outputs the phase signals A, B, C, D, which are then supplied to the booster stages 8.

Finally, the charge pump 12 comprises a regulator circuit 26 receiving on inputs the read voltage $V_{READ}$ and a reference voltage $V_{REF0}$, and supplying on an output a logic-type regulation signal STOP assuming a first logic level, for example a high level, when the read voltage $V_{READ}$ is higher than or equal to the reference voltage $V_{REF0}$, and a second logic level, low in the example considered, when the read voltage $V_{READ}$ is smaller than the reference voltage $V_{REF0}$.

The regulation signal STOP is then supplied to an input of the non-overlapping signal generator stage 24 to interrupt supply of the phase signals A, B, C, D to the booster stages 8 when the read voltage $V_{READ}$ exceeds the reference voltage $V_{REF0}$, in order to prevent malfunctioning of the memory 1, such as phenomena of soft-programming or soft-erasing of the memory cells caused by too high read voltages.

FIG. 2 shows the voltage-current characteristic of the charge pump 12 of FIG. 1. As may be noted, the charge pump 12 is able to supply read voltages $V_{READ}$ having a value that is substantially constant and is equal to the reference voltage $V_{REF0}$ (Approximately 4.5–5 V) for supplied currents of between zero and a value $I_0$ of the order of mA, and for currents higher than $I_0$, values decreasing down to a value equal to that of the supply voltage $V_{CC}$ when the current supplied by the charge pump 12 assumes its maximum value $I_{MAX0}$.

It is moreover known that one of the specifications of nonvolatile memories is that they must guarantee the user correct reading of the data as long as the time elapsing between the supply of two successive addresses to the input of the memory is longer than, or at the most equal to, the memory access time, i.e., in other words, as long as the address transition frequency at the input of the memory is lower than, or at the most equal to, the inverse of the memory access time, which, as is known, is defined as the time elapsing between the instant at which an address is supplied in a stable way to the input of the memory and the instant at which the content of the said address is available on the output of the memory.

Consequently, to guarantee compliance with the specifications regarding reading times, charge pumps are sized in such a way as to be able to meet the maximum current requirement by the decoding circuitry to which they are connected as long as the addresses vary at a frequency lower than, or at the most equal to, the inverse of the memory access time, in such a way as to guarantee that the read voltage $V_{READ}$ will remain constant at the aforesaid value $V_{REF0}$ over the entire memory operation range.

In particular, the current required from the charge pump by the decoding circuitry is not constant but is proportional to the frequency at which the addresses at the input of the memory vary, and presents a pulse pattern with peaks in correspondence of the transitions of the addresses and a mean value that may be expressed by the following relation: I $f_{ADD} \cdot C_{DEC} \cdot V_{READ}$, namely, a mean value that is a function of the address transition frequency $f_{ADD}$, of the read voltage $V_{READ}$, and of the overall capacitance $C_{DEC}$ "seen" by the row decoder. It assumes its maximum value when the row decoder "sees" the maximum capacitance.

The maximum voltage $V_{MAX}$ that the pump charge can theoretically supply when the current requirement is zero is $V_{MAX}=(n+1)\cdot V_{CC}>V_{REF0}$, where n is the number of booster stages forming the charge pump, whereas the maximum current $I_{MAX0}$ that may be supplied by the charge pump when its output voltage is equal to the supply voltage $V_{CC}$ can, instead, be expressed by the following relation: $I_{MAX0}=f_{CK}\cdot C_P\cdot V_{CC}$. Namely, it is equal to the product of the supply voltage $V_{CC}$, the charge pump capacitance $C_P$, and the frequency $f_{CK}$ of the clock signal supplied to the non-overlapping signal generator which generates the phases supplied to the booster stages.

The frequency of the clock signal CK, starting from which the phases of a charge pump are generated, is thus determined in the memory design phase, according, among other things, to the number of booster stages forming the charge pump and the charge pump capacitance $C_P$, in such a way as to guarantee that the read voltage $V_{READ}$ will remain constant at the value $V_{REF0}$ referred to above over the entire memory operation range, i.e., as long as the addresses vary with a frequency lower than, or at the most equal to, the inverse of the memory access time, and hence also when the decoding circuitry absorbs the maximum current.

Most flash nonvolatile memories currently available on the market have a memory access time of approximately 100 ns, and hence a maximum allowable address transition frequency of 10 MHz, and the clock signal from which the phases of the charge pump are generated has a frequency such as to guarantee, with a fair margin, that the read voltage $V_{READ}$ will remain constant at the value $V_{REF0}$ referred to above over the entire memory operation range.

A sizing for guaranteeing correct reading of data over the entire operation range of a flash nonvolatile memory is, however, in contrast with the recent increasing market demand for so-called "stacked" memory devices, i.e., memory devices in which flash nonvolatile memories are used in combination with faster memories, such as SRAM memories, that is, volatile memories having much shorter access times than flash nonvolatile memories.

In particular, in a stacked memory device, a flash non-volatile memory and a faster volatile memory are substantially connected in parallel, i.e., they share, either in part or completely, the same addresses and have their outputs connected in parallel together. Selection of either memory may be made at input via a so-called chip enable signal supplied to the input buffers of the memory, or else at output via a so-called output enable signal supplied to the output buffers of the memory.

In this type of memory devices, when the two memories share the so-called chip enable signal, often a phenomenon commonly referred to as the address skew phenomenon occurs; i.e., it often happens that the address transition frequency at the input of the flash nonvolatile memory exceeds, even abundantly, the maximum frequency acceptable for flash nonvolatile memories (a value of even 66 MHz may be reached), and this phenomenon is the cause of degradation of the performance of the memory device in particular conditions of use thereof.

In particular, the address skew phenomenon is particularly dangerous when it is intended to carry out first a set of readings of the data stored in the faster volatile memory and then to access the data stored in the flash nonvolatile memory. In fact, during the step of reading of the data stored in the faster volatile memory, in which address transition occurs at much higher frequencies than the maximum frequency acceptable for flash nonvolatile memories, it is possible, given the higher demand for current by the decoding circuitry, that the read voltage supplied by the charge pump of the flash nonvolatile memory will drop below a limit value, usually referred to as "failure voltage", below which the number of readings aborted is such as to lead to failure when an attempt is made to actually access data stored in the flash nonvolatile memory.

FIG. 3 illustrates the decay of the read voltage $V_{READ}$ in a flash nonvolatile memory according to the prior art in the presence of address skew. In particular, in FIG. 3 the bold line indicates the graph as a function of time of the read voltage $V_{READ}$ in the presence of addresses having a transition period of 15 ns and in the case where the clock signal CK supplied to the phase generator stage has a period of 60 ns, whilst the thin line indicates the failure voltage $V_{FAIL}$.

SUMMARY OF THE INVENTION

The disclosed embodiments of the present invention provide a charge pump for a memory device that overcomes the above described drawbacks.

In accordance with one embodiment of the invention, a charge pump for a memory device is provided. The charge pump includes a clock generator supplying an output clock signal; a phase generator receiving the output clock signal and supplying phase signals; a voltage boosting circuit receiving a supply voltage and the phase signals and supplying a read voltage higher than the supply voltage; the clock generator including a comparator circuit having a first input receiving the read voltage, a second input receiving a reference voltage, and an output supplying a selection signal indicating the outcome of the comparison between the read voltage and the reference voltage; and a selection circuit have a first signal input receiving a first input clock signal, a second signal input receiving a second input clock signal having a frequency higher than the frequency of the first input clock signal, a selection input receiving the selection signal, and an output supplying the output clock signal and operatively connected to one of the first and second signal inputs in response to the selection signal.

In accordance with another embodiment of the invention, a memory device is provided that includes the charge pump as recited above.

BRIEF DESCRIPTION OF THE DRAWING(S)

For a better understanding of the present invention, a preferred embodiment thereof is now described, purely by way of non-limiting example, with reference to the attached drawings, in which:

FIG. 2 shows the voltage-current characteristic of a charge pump forming part of the nonvolatile memory of FIG. 1;

FIG. 3 shows the graph as a function of time of the read voltage $V_{READ}$ in a nonvolatile memory according to the prior art in the presence of address skew;

DETAILED DESCRIPTION OF THE INVENTION

The present invention is based upon the principle of detecting the presence of the phenomenon of address skew at the input of the nonvolatile memory by checking whether the read voltage $V_{READ}$ supplied by the charge pump drops below a pre-set threshold value, and, upon detection of the presence of address skew, of supplying, to the non-overlapping signal generator of the phase generating circuit, instead of the clock signal generated by the clock generator stage 22, a different clock signal having a frequency higher than that of the clock signal generated by the clock generator stage 22, in particular a clock signal having a frequency correlated to the address transition frequency.

It has in fact been experimentally verified that, in this way, the read voltage under no circumstance drops below the failure voltage, thus eliminating altogether the drawbacks described above that afflict flash nonvolatile memories according to the prior art in the presence of address skew phenomenon.

Figure 1:
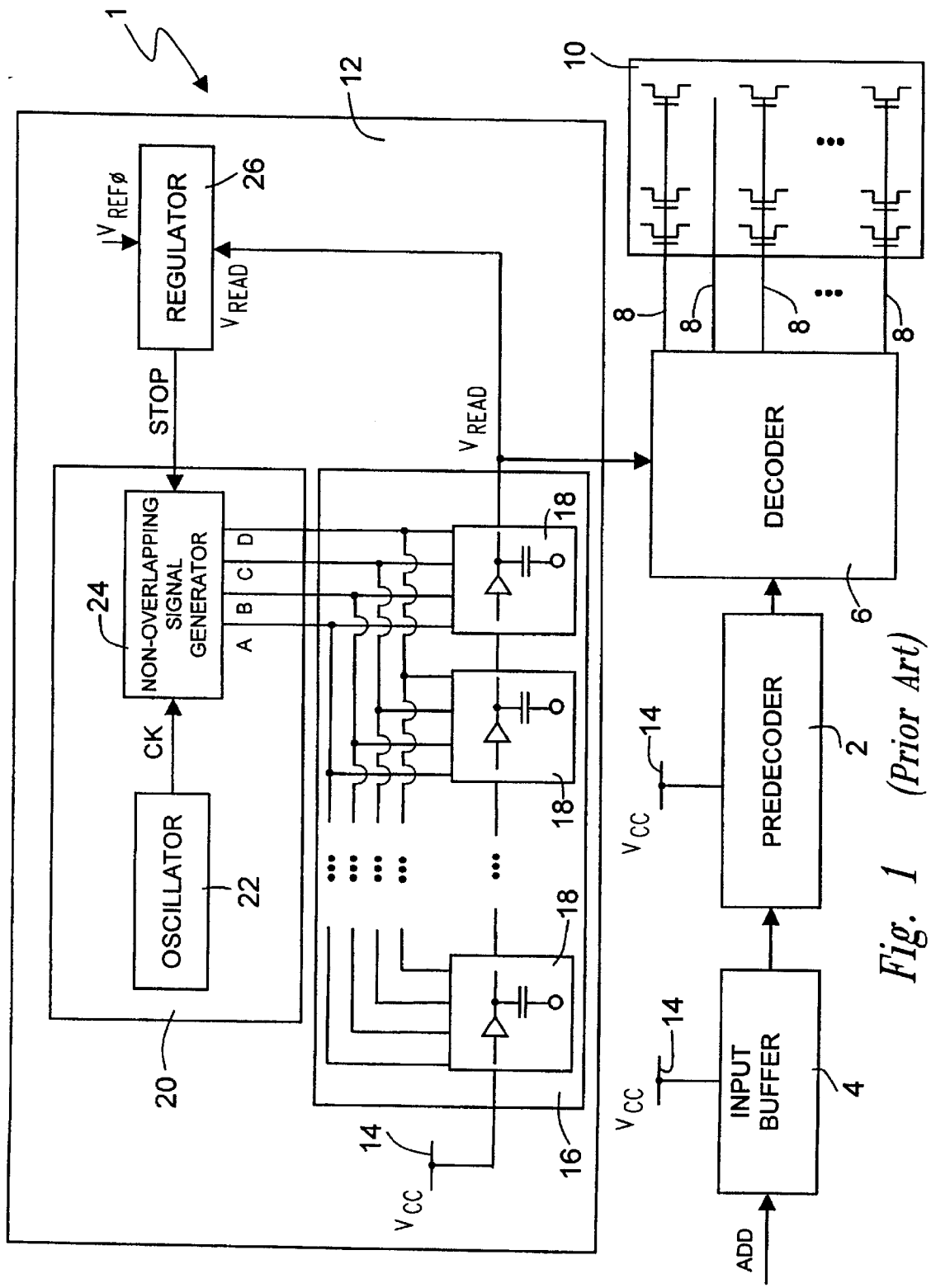
FIG. 1 shows the circuit diagram of one part of a nonvolatile memory according to the prior art.
Figure 4:
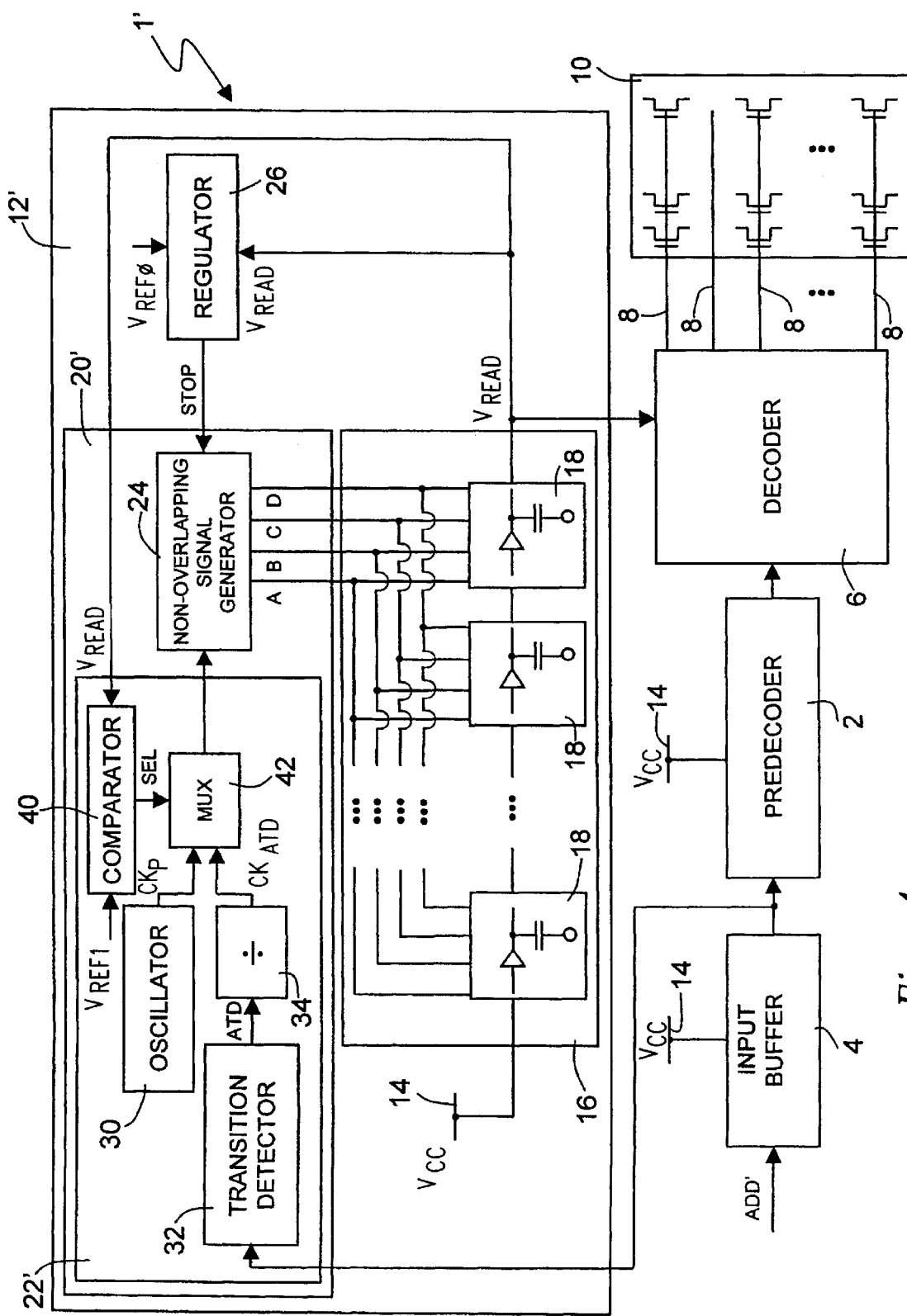
FIG. 4 shows the circuit diagram of a nonvolatile memory according to the present invention.

FIG. 4 shows the circuit diagram of a nonvolatile memory according to the present invention, in which parts that are identical to those of the nonvolatile memory of FIG. 1 are designated by the same reference numbers and will not be described again herein.

As is shown in FIG. 4, the nonvolatile memory, designated as a whole by 1', differs from the nonvolatile memory 1 of FIG. 1 in the circuit structure of the charge pump, here designated by 12', in particular in the circuit structure of the clock generator stage, here designated by 22', of the phase generating circuit, here designated by 20'.

In particular, the clock generator stage 22' comprises an oscillator 30 generating the clock signal described previously with reference to the nonvolatile memory 1 of FIG. 1, and for convenience of description hereinafter referred to as slow clock signal $CK_P$; a transition detector 32 having an input receiving, via the input buffer 4, the addresses ADD supplied to the input of the memory 1', and an output supplying a pulse-type address transition signal ATD, which presents a pulse in correspondence of each address transition, and hence presents a frequency equal to the address transition frequency; and a frequency divider 34 having an input receiving the address transition signal ATD, and an output supplying a clock signal $CK_{ATD}$ having a frequency equal to one half that of the address transition signal ATD, and for convenience of description hereinafter referred to as fast clock signal $CK_{ATD}$.

Figure 5:
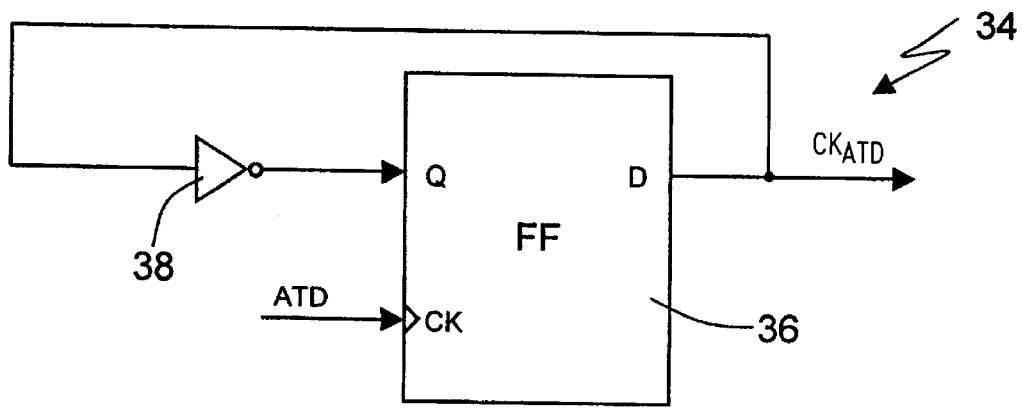
FIG. 5 shows a possible embodiment of a frequency divider forming part of the nonvolatile memory of FIG. 4.

In particular, the frequency divider 34 can conveniently be obtained in the way illustrated in FIG. 5, namely by means of a master-slave flip-flop 36 having a signal output supplying the fast clock signal $CK_{ATD}$, a clock input receiving the address transition signal ATD, and a signal input connected to the signal output via a logic inverter 38. In this way, in fact, the fast clock signal $CK_{ATD}$ switches at each switching edge of the address transition signal ATD.

Figure 6:
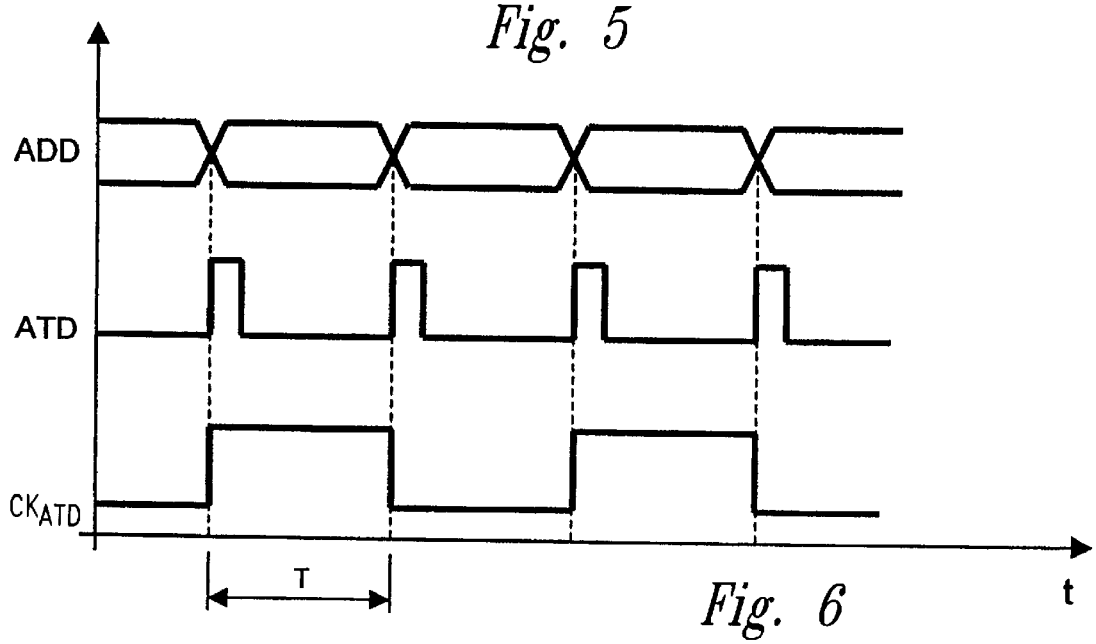
FIG. 6 shows the timing charts of signals used by a charge pump forming part of the nonvolatile memory of FIG. 4 in relation to the transition of the addresses at the input of the nonvolatile memory.

The timing charts of the address transition signal ATD and fast clock signal $CK_{ATD}$ in relation to the transition of the addresses ADD are shown, by way of example, in FIG. 6.

With reference again to FIG. 4, the clock generator stage 22' further comprises a comparator 40 receiving on the inputs the read voltage $V_{READ}$, and a reference voltage $V_{REF1}$ correlated to the aforesaid failure voltage $V_{FAIL}$, and supplying on the output a logic-type selection signal SEL, which assumes a first logic level, for example a high level, when the voltage $V_{READ}$ is lower than or equal to the reference voltage $V_{REF1}$, and a second logic level, low in the example considered, when the voltage $V_{READ}$ is higher than the reference voltage $V_{REF1}$.

In particular, the voltage $V_{REF1}$ is slightly higher than the failure voltage $V_{FAIL}$; for example, it is equal to the failure voltage $V_{FAIL}$ (approximately 3.5 V) increased by approximately 300 mV. Furthermore, conveniently the comparator 40 is of the type with hysteresis so as to prevent troublesome switchings between the two clock signals $CK_P$ and $CK_{ATD}$.

Finally, the clock generator stage 22' comprises a multiplexer 42 having a first signal input receiving the fast clock signal $CK_{ATD}$, a second signal input receiving the slow clock signal $CK_P$, a selection input receiving the selection signal SEL supplied by the comparator 40, and an output supplying the aforesaid clock signal CK, which is then supplied to the non-overlapping signal generator 24.

In particular, the clock signal CK supplied by the multiplexer 42 is constituted by the fast clock signal $CK_{ATD}$ when the selection signal SEL assumes the first logic level (high level), namely, when the read voltage $V_{READ}$ is smaller than or equal to the reference voltage $V_{REF1}$, whereas it is constituted by the slow clock signal $CK_P$ when the selection signal SEL assumes the second logic level (low level), namely, when the read voltage $V_{READ}$ is higher than the reference voltage $V_{REF1}$. With the above-described architecture, when no address skew is present, the read voltage $V_{READ}$ supplied by the charge pump 12' is higher than the reference voltage $V_{REF1}$ (and hence also higher than the failure voltage $V_{FAIL}$), the selection signal SEL supplied by the comparator 40 assumes the second logic level (low level), and hence the slow clock signal $CK_P$ supplied by the oscillator 30 is present on the output of the multiplexer 42. In this condition, then, the memory 1' operates as the memory 1 of FIG. 1, that is, with the clock signal determined in the phase of design of the memory 1' to meet the maximum current demand by the decoding circuitry when the addresses vary with a frequency at the most equal to the inverse of the memory access time.

When, instead, an address skew is present, as soon as the read voltage $V_{READ}$ supplied by the charge pump 12' drops below the reference voltage $V_{REF1}$ (but in any case is still higher than the failure voltage $V_{FAIL}$), the selection signal SEL supplied by the comparator 40 assumes the first logic level (high level), and hence on the output of the multiplexer 42 there is present the fast clock signal $CK_{ATD}$ supplied by the frequency divider 34. In this condition, then, the charge pump 12' operates with phase signals generated starting from a clock signal having a frequency higher than that of the clock signal used in normal operation of the memory 1' and proportional to the address transition frequency, and in this way it has been experimentally verified that the read voltage $V_{READ}$ under no circumstance drops below the aforesaid failure voltage $V_{FAIL}$.

Figure 7:
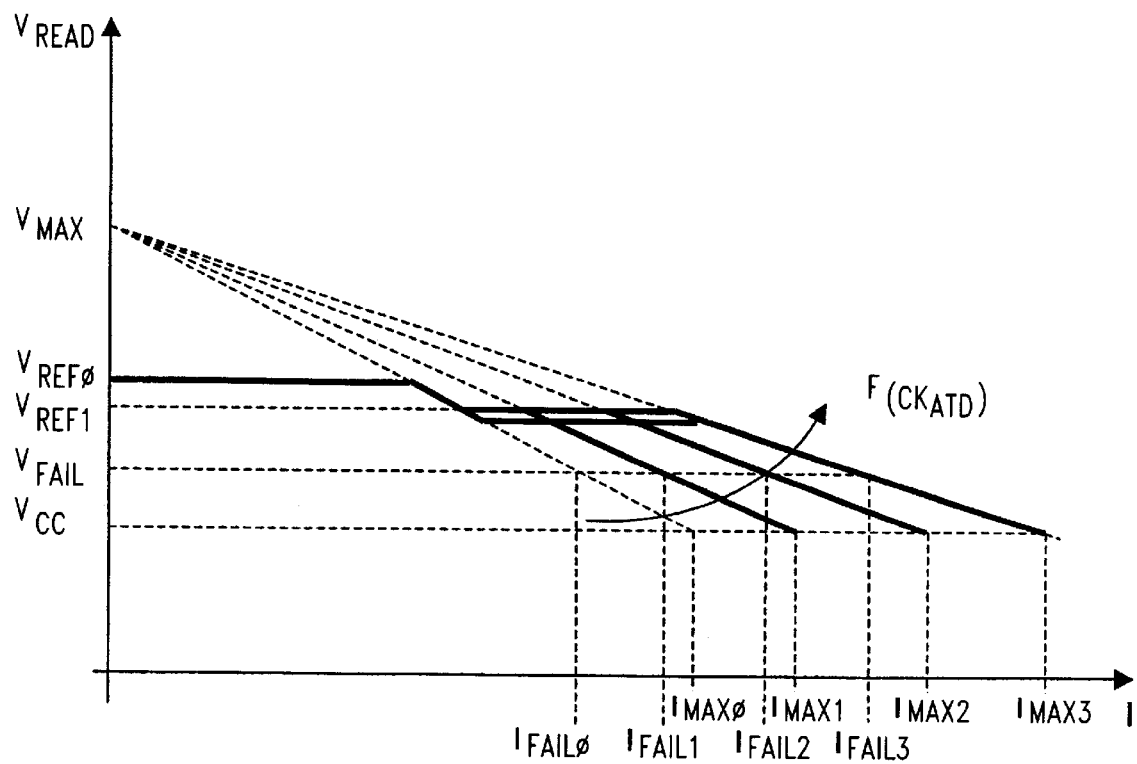
FIG. 7 shows the voltage-current characteristic of the charge pump.

In particular, with the use of the present invention the voltage-current characteristic of the charge pump 12 represented in FIG. 2 is modified into the one shown in FIG. 7, from which there may be clearly seen the marked increase in the value of the current that the charge pump 12' is able to supply to the decoding circuitry before the possible occurrence of a failure in reading.

It has been moreover experimentally verified by the present applicant that the use of the present invention in a nonvolatile memory having 100-ns access time makes it possible to guarantee that the read voltage $V_{READ}$ will remain higher than the failure voltage $V_{FAIL}$ even in the presence of 15-ns address skew.

Figure 8:
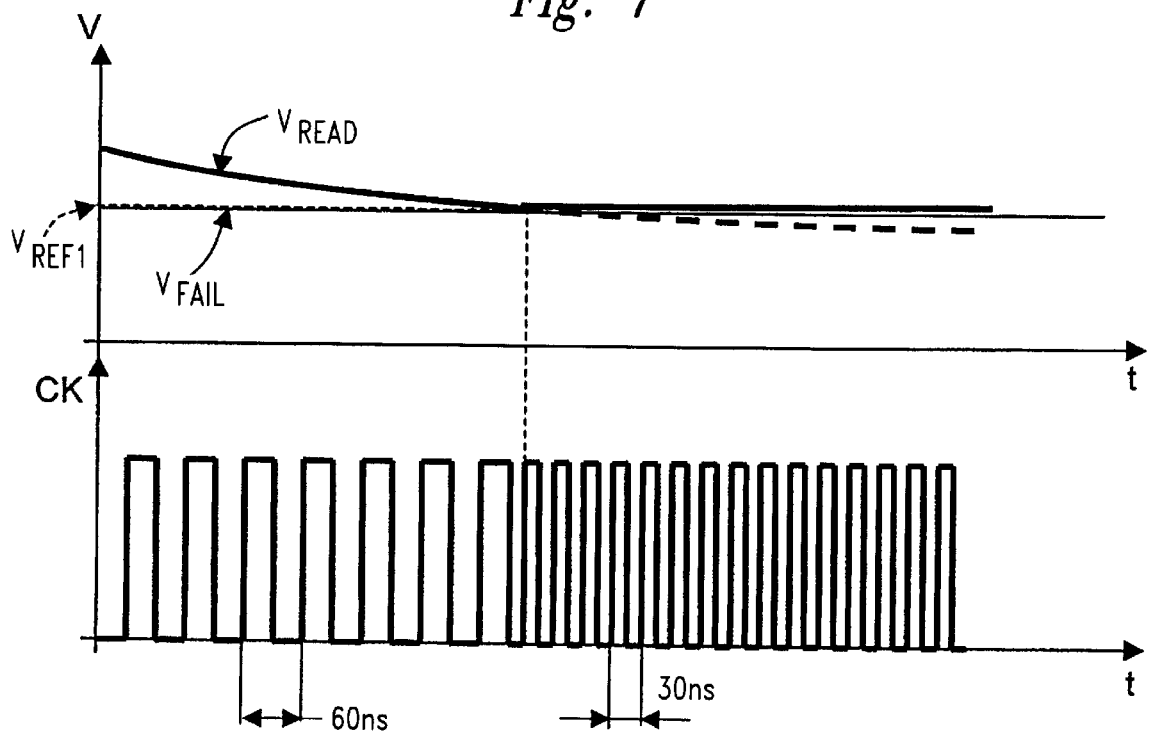
FIG. 8 shows the graph as a function of time of the read voltage $V_{READ}$ in a nonvolatile memory according to the present invention in the presence of address skew.

FIG. 8 shows the graph as a function of time of the read voltage $V_{READ}$ in a flash nonvolatile memory according to the present invention in the presence of address skew. In particular, in FIG. 8 the bold line indicates the graph as a function of time of the read voltage $V_{READ}$ in the presence of addresses having a 15-ns transition period and in the case where the clock signal CK supplied to the phase generator stage initially has a 60-ns period and then a 30-ns period, whilst the thin line indicates the failure voltage $V_{FAIL}$. Furthermore, to facilitate comparison with FIG. 3, in FIG. 8 the dashed line indicates the graph of the read voltage $V_{READ}$ as shown in FIG. 3, namely, the graph of the read voltage $V_{READ}$ in a flash nonvolatile memory according to the prior art in the presence of the same address skew.

Finally, it is clear that numerous modifications and variations may be made to the charge pump and to the nonvolatile memory described and illustrated herein, without thereby departing from the scope of the present invention, as defined by the attached claims.

For example, if the duty-cycle of the address transition signal ATD so permits, it is even possible not to envisage the use of the frequency divider 34, and to supply the address transition signal ATD directly to the signal input of the multiplexer 42, thus further increasing the dynamics of the memory 1' in terms of address skew. In this case, then, the address transition signal ATD would constitute directly the fast clock signal $CK_{ATD}$.

Alternatively, in applications in which this were to prove necessary, the fast clock signal $CK_{ATD}$ could be generated starting from the address transition signal ATD, using a number of frequency dividers cascaded together.

In addition, the fast clock signal $CK_{ATD}$ could not have a frequency proportional to the address transition frequency. In particular, the fast clock signal $CK_{ATD}$ could be generated by an oscillator distinct from the one that generates the slow clock signal $CK_P$, and could have a frequency higher than that of the slow clock signal $CK_P$ and established in the nonvolatile memory design phase.

Figure 9:
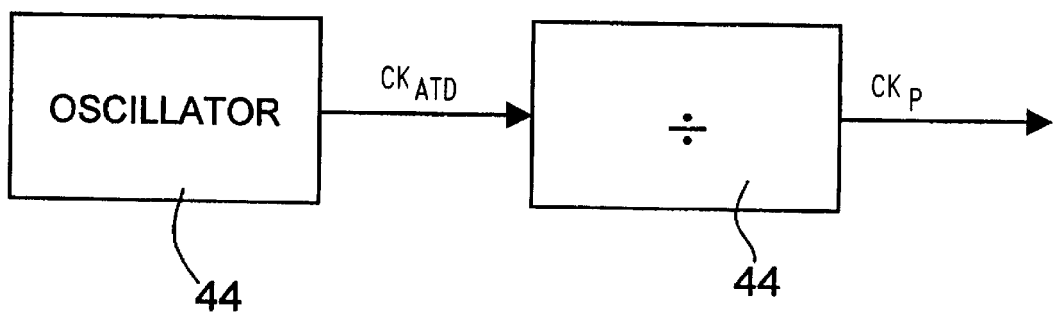
FIG. 9 shows the circuit diagram of a possible variant of the nonvolatile memory of FIG. 4.

Alternatively, as shown in FIG. 9, the fast clock signal $CK_{ATD}$ could be generated by an oscillator 44, and the slow clock signal $CK_P$ could be obtained from the former signal via a frequency divider 46, this also being made as shown in FIG. 5.

Furthermore, the non-overlapping signal generator stage 24 could supply a number of phase signals different from the one described.

From the foregoing it will be appreciated that, although specific embodiments of the invention have been described herein for purposes of illustration, various modifications may be made without deviating from the spirit and scope of the invention. Accordingly, the invention is not limited except as by the appended claims and the equivalents thereof.

What is claimed is:

1. A charge pump for a memory device, comprising: clock generating means supplying an output clock signal; phase generating means receiving said output clock signal and supplying phase signals; voltage boosting means receiving a supply voltage and said phase signals, and supplying a read voltage higher than said supply voltage; said clock generating means comprising comparator means having a first input receiving said read voltage, a second input receiving a reference voltage, and an output supplying a selection signal indicating the outcome of the comparison between said read voltage and said reference voltage; and selection means having a first signal input receiving a first input clock signal, a second signal input receiving a second input clock signal having a frequency higher than the frequency of said first input clock signal, a selection input receiving said selection signal, and an output supplying said output clock signal, and operatively connectable to one of said first and second clock input signals in response to said selection signal.

2. The charge pump of claim 1, wherein said second input clock signal is a function of the transition frequency of addresses supplied to said memory device.

3. The charge pump of claim 2, wherein said clock generating means further comprise transition detecting means receiving said addresses supplied to said memory device, and supplying an address transition signal having a frequency correlated to the transition frequency of said addresses, said address transition signal defining said second input clock signal.

4. The charge pump of claim 3 wherein said address transition signal has a frequency equal to the transition frequency of the addresses supplied to said memory device.

5. The charge pump of claim 3 wherein said address transition signal is a pulse signal having a pulse at each transition of the addresses supplied to said memory device.

6. The charge pump of claim 2, wherein said clock generating means further comprise transition detecting means receiving said addresses supplied to said memory device, and supplying an address transition signal having a frequency correlated to the transition frequency of said addresses; and frequency dividing means receiving said address transition signal and supplying said second input clock signal.

7. The charge pump of claim, 6, wherein said frequency dividing means comprise master-slave flip-flop means having a signal output supplying said second clock signal, a clock input receiving said address transition signal, and a signal input connected to said signal output through inverter means.

8. The charge pump of claim 2, wherein said clock generating means comprise oscillating means generating said second clock signal, and frequency dividing means receiving said second clock signal, and supplying said first clock signal.

9. The charge pump of claim 1, wherein said selection signal is a logic-type signal assuming a first logic level when said read voltage and said reference voltage satisfy a preset relation, and a second logic level when said read voltage and said reference voltage do not satisfy said pre-set relation.

10. The charge pump of claim 9, wherein said pre-set relation is defined by the condition that said read voltage is higher than or equal to said reference voltage.

11. The charge pump of claim 1, wherein said reference voltage is higher than a failure voltage below which it is no longer possible to read a memory location correctly.

12. The charge pump of claim 1, wherein said first input clock signal has a frequency to maintain said read voltage supplied by said charge pump substantially equal to a pre-determined threshold value as long as the addresses supplied to said memory device have transition times higher than or equal to an access time of said memory device.

13. The charge pump of claim 1, further comprising oscillator means generating said first input clock signal.

14. The charge pump of claim 1, wherein said selection means comprise multiplexer means.

15. The charge pump of claim 1, wherein said comparator means are comparator means with hysteresis.

16. A memory device, comprising:
a plurality of memory cells; and
a charge pump coupled to the plurality of memory cells, the charge pump comprising:
   clock generating means supplying an output clock signal; phase generating means receiving said output clock signal and supplying phase signals; and voltage boosting means receiving a supply voltage and said phase signals, and supplying a read voltage higher than said supply voltage; said clock generating means comprising comparator means having a first input receiving said read voltage, a second input receiving a reference voltage, and an output supplying a selection signal indicating the outcome of the comparison between said read voltage and said reference voltage; and selection means having a first signal input receiving a first input clock signal, a second signal input receiving a second input clock signal having a frequency higher than the frequency of said first input clock signal, a selection input receiving said selection signal, and an output supplying said output clock signal, and operatively connectable to one of said first and second input clock signals in response to said selection signal.

17. A nonvolatile memory device, comprising:
a plurality of nonvolatile memory cells; and
a charge pump coupled to the plurality of nonvolatile memory cells, the charge pump comprising:
   clock generating means supplying an output clock signal; phase generating means receiving said output clock signal and supplying phase signals; and voltage boosting means receiving a supply voltage and said phase signals, and supplying a read voltage higher than said supply voltage; said clock generating means comprising comparator means having a first input receiving said read voltage, a second input receiving a reference voltage, and an output supplying a selection signal indicating the outcome of the comparison between said read voltage and said reference voltage; and selection means having a first signal input receiving a first input clock signal, a second signal input receiving a second input clock signal having a frequency higher than the frequency of said first input clock signal, a selection input receiving said selection signal, and an output supplying said output clock signal, and operatively connectable to one of said first and second input clock signals in response to said selection signal.

18. A charge pump for a nonvolatile memory, comprising:
a clock generator circuit configured to supply an output clock signal;
a phase generator circuit configured to receive the output clock signal and to supply phase signals; and
a voltage booster circuit configured to receive a supply voltage supplied from outside the nonvolatile memory and the phase signals from the phase generator circuit and to generate a read voltage that is higher than the supply voltage;
said clock generator circuit comprising a comparator receiving the read voltage and a reference voltage and generating a selection signal indicating the outcome of the comparison between the read voltage and the reference voltage, and a multiplexer receiving a first input clock signal have a pre-set frequency, a second input clock signal having a frequency correlated to the transition frequency of the addresses supplied to the nonvolatile memory, and further receiving the selection signal, and generating the output clock signal.

19. A charge pump for a nonvolatile memory, comprising:
a clock generator circuit configured to supply an output clock signal;
a phase generator circuit configured to receive the output clock signal and to supply phase signals; and
a voltage booster circuit configured to receive a supply voltage supplied from outside the nonvolatile memory and the phase signals from the phase generator circuit and to generate a read voltage that is higher than the supply voltage;
said clock generator circuit comprising a comparator receiving the read voltage and a reference voltage and generating a selection signal indicating the outcome of the comparison between the read and the reference voltages, and a multiplexer receiving a first input clock signal have a pre-set frequency, a second input clock signal having a first frequency correlated to the transition frequency of the addresses supplied to the nonvolatile memory, and further receiving the selection signal, and generating the output clock signal, the clock generator circuit further comprising a transition detecting circuit configured to receive the addresses supplied to the memory device and to generate an address transition signal having a frequency correlated to the transition frequency of the addresses, the address transition signal defining the second input clock signal.

* * * * *

UNITED STATES PATENT AND TRADEMARK OFFICE
CERTIFICATE OF CORRECTION

PATENT NO.    : 6,560,145 B2
DATED         : May 6, 2003
INVENTOR(S)   : Ignazio Martines et al.

It is certified that error appears in the above-identified patent and that said Letters Patent is hereby corrected as shown below:

Title page,
Item [73], Assignee, should read as -- STMicroelectronics S.r.l., Agrate Brianza (IT) --

Column 8,
Lines 18 and 19, "clock input signals" should be corrected to read as -- input clock signals --.

Signed and Sealed this

Thirtieth Day of September, 2003

JAMES E. ROGAN
*Director of the United States Patent and Trademark Office*